United States Patent
Huang et al.

(10) Patent No.: US 6,455,389 B1
(45) Date of Patent: Sep. 24, 2002

(54) METHOD FOR PREVENTING A BY-PRODUCT ION MOVING FROM A SPACER

(76) Inventors: Kuo-Tai Huang, 17, Alley 37, Lane 72, Kuang-Hua 2nd St., Hsin-Chu City (TW); Chao-Sheng Lin, 25, Lane 78, Jui-Lung E. Rd., Feng-Shan, Kaohsiung (TW); Li-Wei Cheng, 29, Lane 38, Tzi-Yu Rd., Hsin-Chu City (TW)

( * ) Notice: Subject to any disclaimer, the term of this patent is extended or adjusted under 35 U.S.C. 154(b) by 0 days.

(21) Appl. No.: 09/872,261

(22) Filed: Jun. 1, 2001

(51) Int. Cl.[7] .................. H01L 21/336; H01L 21/3205; H01L 21/4763
(52) U.S. Cl. ................ 438/305; 438/303; 438/592
(58) Field of Search ................ 438/305, 303, 438/592, 230, 231, 239

(56) References Cited

U.S. PATENT DOCUMENTS

| | | | | |
|---|---|---|---|---|
| 4,799,745 A | * | 1/1989 | Meyer et al. | 350/1.7 |
| 6,235,600 B1 | * | 5/2001 | Chiang et al. | 438/305 |
| 6,255,175 B1 | * | 7/2001 | Yu | 438/289 |
| 6,271,096 B1 | * | 8/2001 | Jan et al. | 438/303 |
| 6,287,925 B1 | * | 9/2001 | Yu | 438/301 |
| 6,306,701 B1 | * | 10/2001 | Yeh | 438/231 |
| 6,316,304 B1 | * | 11/2001 | Pradeep et al. | 438/230 |
| 6,316,321 B1 | * | 11/2001 | Lin et al. | 438/305 |
| 6,323,519 B1 | * | 11/2001 | Gardner et al. | 257/336 |
| 6,335,279 B2 | * | 1/2002 | Jung et al. | 438/666 |

* cited by examiner

Primary Examiner—John F. Niebling
Assistant Examiner—Walter L. Lindsay, Jr.
(74) Attorney, Agent, or Firm—Powell goldstein Frazer & Murphy LLP

(57) ABSTRACT

This invention relates to a method that prevents by-productions from moving from a spacer. In particular by using an offset liner, a liner with a treated surface and a spacer that is formed by using the atomic layer deposition method or the rapid thermal chemical vapor deposition method. The present invention uses a liner, whose surface is treated, and a spacer, which is formed by using the atomic layer deposition method or the rapid thermal chemical vapor deposition method. This prevents by-product ions from moving from the spacer to other regions by using actions in diffusion and drift to affect the voltage stability of the semiconductor device after the current is connected. This defect will further affect qualities of the semiconductor device.

17 Claims, 5 Drawing Sheets

METHOD FOR PREVENTING A BY-PRODUCT ION MOVING FROM A SPACER

BACKGROUND OF THE INVENTION

1. Field of the Invention

This invention relates to a method for preventing by-product ions moving from a spacer, and particularly relates to the method for preventing by-products ions moving from a spacer to other regions by using an offset liner, a liner ,whose surface is treated, and a spacer, which is formed by using the atomic layer deposition method or the raped thermal chemical vapor deposition method. The by-product ions, which is in the spacer, will be fixed in the spacer region to increase the voltage stability of the semiconductor device after the current is connected, and further to increase qualities of the semiconductor device.

2. Description of the Prior Art

In general, when a spacer is formed over the polysilicon gate, most used material of the spacer is an in insulating material to decrease the probability of occurring, electric leakage defects in the polysilicon gate. The liner is usually formed outside of the polysilicon gate to increase the combined ability between the spacer and the polysilicon gate and to prevent the electric leakage and stress defects occurring in the polysilicon gate. The most used insulating material of the spacer is silicon nitride and the combined ability between silicon nitrate and polysilicon is very low. Therefore, of a liner is not formed outside of the poluysilicon gate, a vacant space is usually formed between the polysilicon gate and the spacer to affect the qualities of the semiconductor elements.

The objective of the liner is used to be an interface between the polysilicon gate and the spacer to increase the combined qualities at the place which is between the polysilicon gate and the spacer. This condition can prevent the electric leakage and stress defects occurring in the polysilicon gate. Therefore, the material of the liner must have finer combined ability with the polysilicon gate and the spacer to reach its efficiency.

In general, the most used material of the liner is silicon dioxide, because silicon dioxide has a finer combined ability with the polysilicon gate and the spacer. The traditional method for forming the silicon dioxide layer to be the liner over the polysilicon gate is to use the thermal oxide process. At first, a wafer that comprises a decided dimension polysilicon gate on the substrate is placed into the chamber of the furnace. When the temperature of the chamber reaches to about 700° C., oxygen is transported. In the process, the oxygen atoms permeate to the surface of the polysilicon gate and react to become a silicon dioxide thin layer to be the liner. Then a silicon nitride layer is formed on the liner by using a furnace process. At last, the spacer is obtained by using an etching process to remove partial silicon nitride layer.

In the forming spacer process, silane ($SiH_4$) or dichloride silane ($SiH_2Cl_2$) will be used to react with ammonia ($NH_3$) to form silicon nitride to be the spacer by using the furnace process or the rapid thermal chemical vapor deposition (RTCVD) process. In the furnace process, the temperature of the chamber is about 680 to 780° C. and the pressure of the chamber is about 20 to 60 pascal (Pa). The proceeding time of the furnace process is about 2 to 6 hours. In the rapid thermal chemical vapor deposition process, the temperature of the chamber is about 650 to 700° C. and the pressure of the chamber is about 200 to 600 torr. The proceeding time of the rapid thermal chemical vapor deposition process is about 2 to 4 minutes. In the chemical reaction process, the by-product, such as hydrogen ($H_2$) and hydrochloric (HCl), will be generated following the chemical reaction. These by-product particles will become the ions, whose kinetic energy is higher, in the high temperature environment to move to other regions by using the actions in diffusion or draft. When these ions move to the region, under the gate, the ions will easily react with the impurities, which, and will stay under the gate. When the current is connected with the semiconductor device, the short channel effects will be easily found at the region, which is under the gate to affect the voltage stability of the semiconductor device. This defect will further affect the efficiency and the quality of the semiconductor device. Among the by-product particles, the hydrogen ion in particular causes the most serious effects. Therefore, the present invention method must be used, decrease the temperature of the spacer forming process and thus reduce the amount of by-product ions within the spacer. This condition can prevent the by-product ions from moving to other regions within the spacer and avoid the effects in voltage stability of the semiconductor device.

Although the temperature of the forming spacer process is decreased, the back-end process of the semiconductor will still need the high temperature process to conform to the needs of the entire process. Traditional silicon dioxide liners, formed by using the thermal oxide method, although can combine the polysilicon gate and spacer successfully to prevent the electric leakage and stress defects occurring in the polysilicon gate. This silicon dioxide liner can not resist the by-product ions, which are in the spacer, passing through this liner and moving to the region, which is under the gate, by the actions in diffusion and drift in the high temperature environment to affect the voltage stability of the semiconductor device.

SUMMARY OF THE INVENTION

In accordance with the background of the above-mentioned invention, the traditional method cannot reduce the amount of by-product ions in the spacer and cannot prevent the by-product ions from moving to other regions which affect the voltage stability after the current is connected to the semiconductor device. The main objective of the present invention is to prevent the by-product ions that are in the spacer from moving to other regions by using an offset liner, a liner, whose surface is treated, and a spacer, which is formed by using the atomic layer deposition method or the rapid thermal chemical vapor deposition method.

The second objective of this invention is to reduce the thermal budget of the spacer process by using an offset liner, a liner, whose surface is treated, and a spacer, which is formed by using the atomic layer deposition method or the rapid thermal chemical vapor deposition method.

The third objective of this invention is to increase the voltage stability of the semiconductor device after the current is connected to the semiconductor device by using an offset liner, a liner, whose surface is treated, and a spacer, which is formed by using the atomic layer deposition method or the rapid thermal chemical vapor deposition method.

The fourth objective of this invention is to increase the quality of the semiconductor device by using an offset liner, a liner, whose surface is treated, and a spacer, which is formed by using the atomic layer deposition method or the rapid thermal chemical vapor deposition method.

It is a further objective of this invention to reduce the cost of production by using an offset liner, a liner, whose surface is treated, and a spacer, which is formed by using the atomic layer deposition method or the rapid thermal chemical vapor deposition method.

In according to the foregoing objectives, the present invention provides a method to prevent by-product ions from moving from the spacer to other regions by using an offset liner, a liner, whose surface is treated, and a spacer, which is formed by using the atomic layer deposition method or the rapid thermal chemical vapor deposition method. The present invention can also increase the voltage stability and the quality of the semiconductor device after the current is connected to the semiconductor device. The present invention can further increase the yield of the product, reduce cost of the production, and increase the efficiency of the process.

BRIEF DESCRIPTION OF THE DRAWINGS

In the accompanying drawing forming a material part of this description, there is shown.

DESCRIPTION OF THE PREFERRED EMBODIMENT

The foregoing aspects and many of the attendant advantages of this invention will become more readily appreciated as the same becomes better understood with reference to the following detailed description, when taken in conjunction with the accompanying drawings, wherein:

The silicon dioxide liner, which is formed by using the traditional thermal oxide method, can not prevent the by-product ions, which are formed in the spacer from moving to the region under the gate. The actions in diffusion and drift affect the voltage stability of the semiconductor device. The present invention provides a liner, which can prevent the by-product ions from moving from the spacer to the region under the gate, at first.

Figure 1:
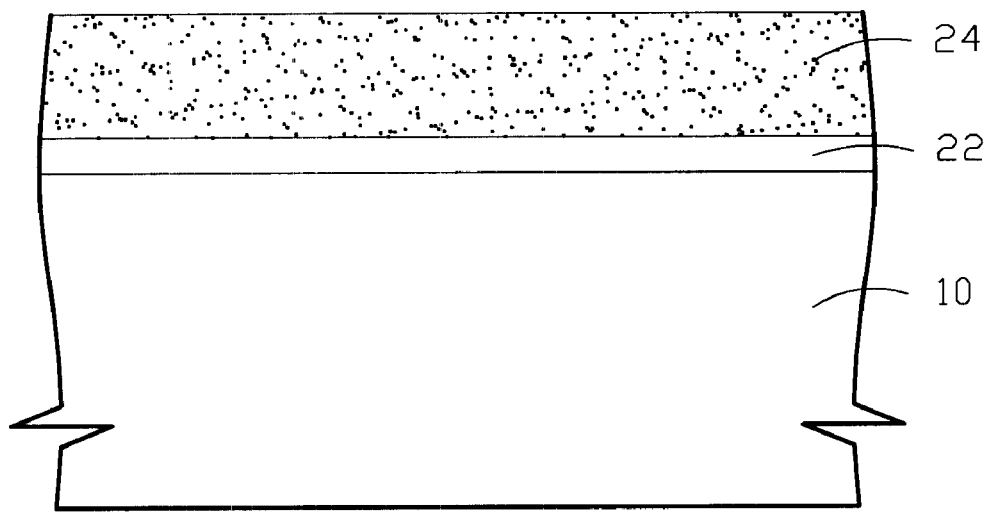
FIG. 1 shows a diagram in forming a gate oxide layer and a silicon layer on a substrate.
Figure 2:
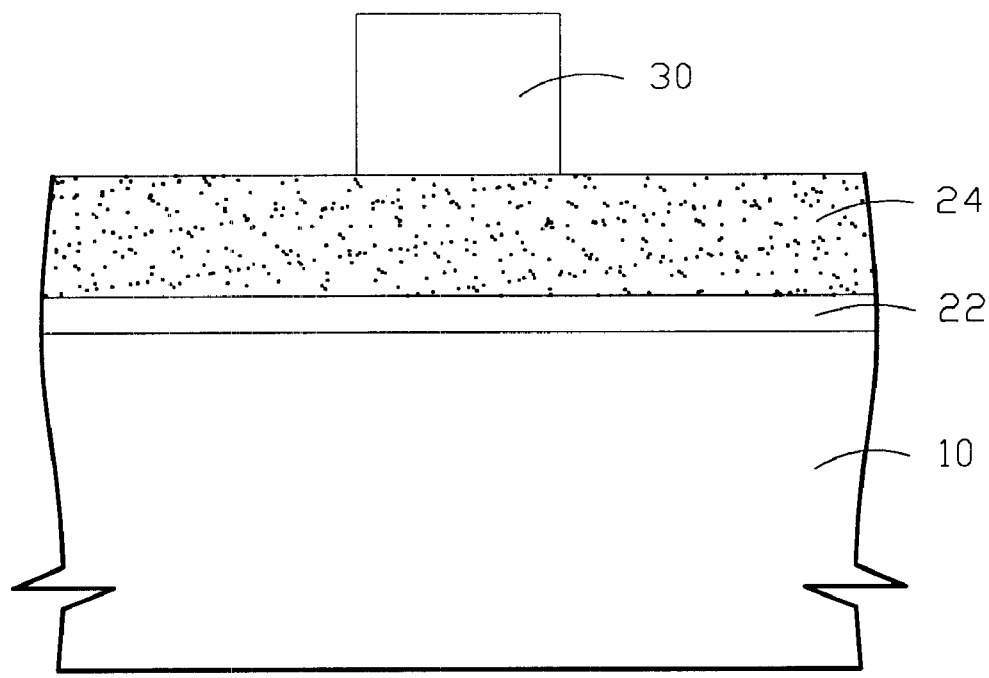
FIG. 2 shows a diagram in forming a mask layer, which is located at the place of a gate, on the silicon layer.

Referring to FIG. 1, a gate oxide layer 22 is formed on a substrate 10 of a wafer and a silicon layer 24 is formed on the gate oxide layer 22. The silicon layer is a polysilicon layer. Referring to FIG. 2, after deciding the place of the gate, the mask layer 30, which is located at the place of the gate, is formed on the silicon layer 24. After the etching process to remove the partial gate oxide layer 22 and silicon layer 24 and removing the mask layer 30 by using the chemical solvent, a gate 20 is formed on the silicon substrate 10 of the wafer.

Figure 3:
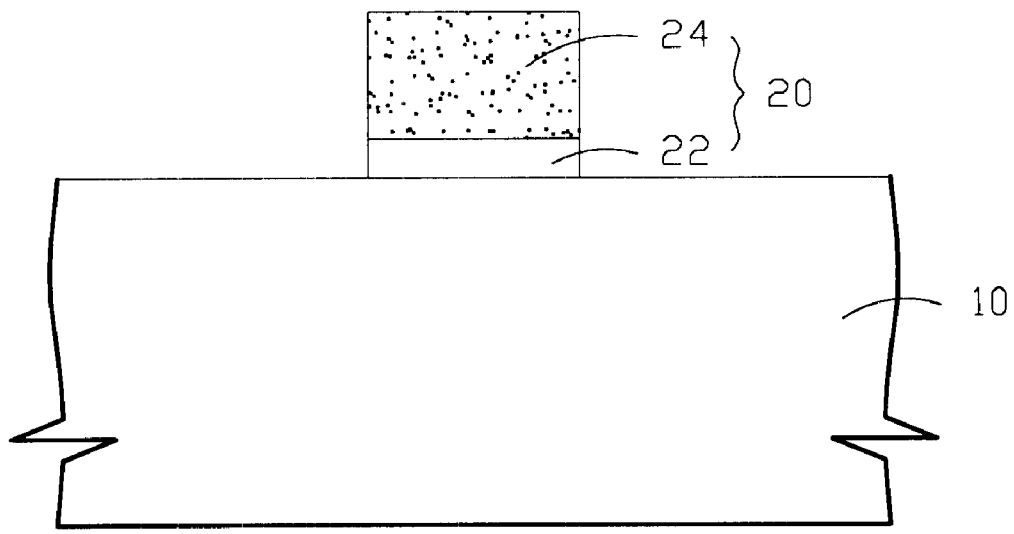
FIG. 3 shows a diagram in forming a gate on the substrate.

FIG. 3 shows a diagram in the gate 20. The gate 20 comprises a silicon layer 24 and a gate oxide layer 22. Using a thermal oxide process to be a pad oxide layer on the silicon substrate 10 forms the gate oxide layer 22. The silicon layer 24 is formed on the gate oxide layer 22.

Figure 4:
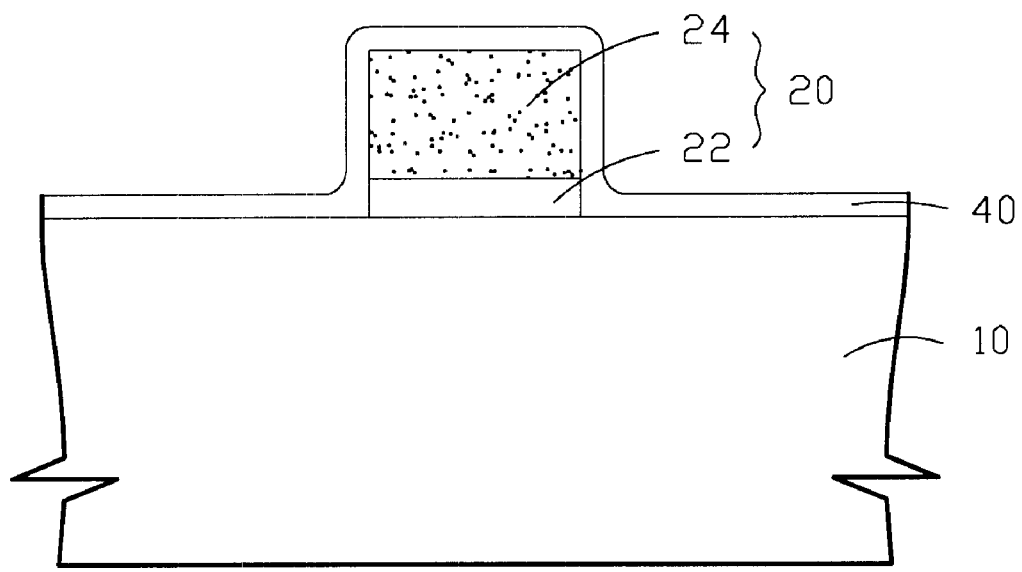
FIG. 4 shows a diagram in forming a liner on a gate.

Referring to FIG. 4, a liner is formed on the gate 20 and the substrate 10. There are a lot of methods that may be used to form the liner. The present invention provides several methods to form the liner to conform to the needs of the process.

The first method is to form a silicon oxynitride lyer on the gate 20 and the substrate 10 by using the rapid thermal chemical vapor deposition to be the liner. The temperature of this process is about 600 to 750° C. and the pressure of this process is about 200 to 760 torr. The proceeding time of this process is about 1 to 4 minutes. At first, the wafer is placed into the chamber. After the temperature of the chamber reaches to a designed value, silane, water, and ammonia are transmitted into the chamber to form a silicon oxynitride on the substrate and the gate to be the liner. The property of the silicon oxynitride, which is formed by using the rapid thermal chemical vapor deposition method, tends to the oxide to avoid the nitride contacting with the silicide to result over high stress. The over high stress will affect the quality of the semiconductor device. The hardness of the silicon oxynitride surface is higher, therefore, the by-product ions, which are formed in the back-end spacer process, will be resisted outside of the liner. The by-product ions can not pass through the liner to the region, which is under the gate, by the actions in diffusion and drift to affect the voltage stability of the semiconductor device.

Figure 5:
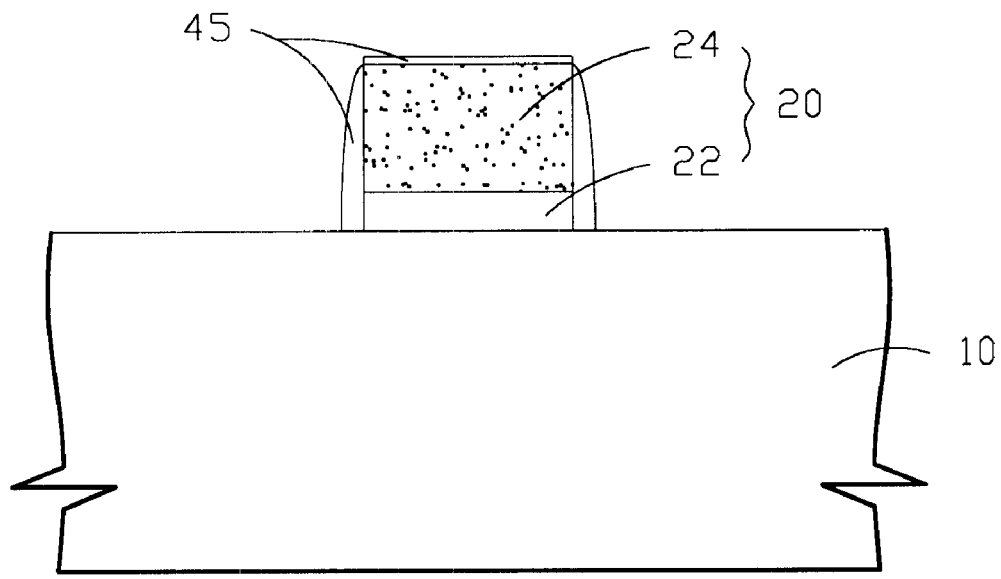
FIG. 5 shows a diagram in forming an offset liner on a gate.

The second method is to form the first liner on the gate and the substrate. The material of the first liner is the oxide, such as tetraethylorthosilicate (TEOS) and high thermal oxide (HTO). Referring to FIG. 5, then proceeding a etching back process to remove the partial first liner. The remained first liner that is on the gate 20 and substrate 10 is used to be the offset liner 45. The function of the offset liner 45 is to avoid the saturation current of the gate from decreasing too quickly. Therefore, the offset liner 45 must be used to decrease the decreasing rate of the gate 20 saturation current.

After forming the offset liner 45 on the gate 20 and the substrate 10, the surface of the offset liner 45 is treated by using the plasma treatment, such as the remote plasma nitridation method or the decouple plasma nitridation method, to increase the hardness of the liner surface. Then the offset liner process is finished.

The principle of the remote plasma nitridation method and the decouple plasma nitridation method is to send an article into an electric field at first. Then nitrogen ($N_2$) or the mixture, which comprises nitrogen and helium (He), is transmitted. The gas will become ions and the ions will be speeded up to attack the surface of the article in the electric field. The hardness of the article surface will be higher than the article surface, which is without ion treatment. When the remote plasma nitridation process is proceed, the temperature of the process is about 500 to 750° C., the pressure of the process is about 1 to 3 torr, and the proceeding time of the process is about 30 to 120 seconds. When the decouple plasma nitridation process is proceed, the temperature of the process is about 50 to 200° C., the pressure of the process is about 0.5 to 20 torr, and the proceeding time of the process is about 30 to 120 seconds. The different plasma nitridation methods are used in different needs of the process.

After passing through the remote plasma nitridation process or the decouple plasma nitridation process, the surface of the offset liner 45 will usually occur the appearance of stress concentration. Therefore, a reoxide process is proceed at this time to decrease this stress concentration defect which is occurred in the surface of the offset liner 45 and to avoid the defect affecting the quality of the semiconductor device. Following the needs of the process, the reoxide process will be proceed in the following process and will not be limited to be proceed after the remote plasma nitridation process or the decouple plasma nitridation process.

After the offset liner 45 is formed, then the lightly doped drain process is proceed. The objective of this process is to decrease the defects, which are occurred by the hot carrier effects. The reoxide process is usually proceed after the lightly doped drain process to repair the surface, which is damaged in the lightly doped drain process. But following the needs of the process, the reoxide process will not be limited to be proceed after the lightly doped drain process.

Figure 6:
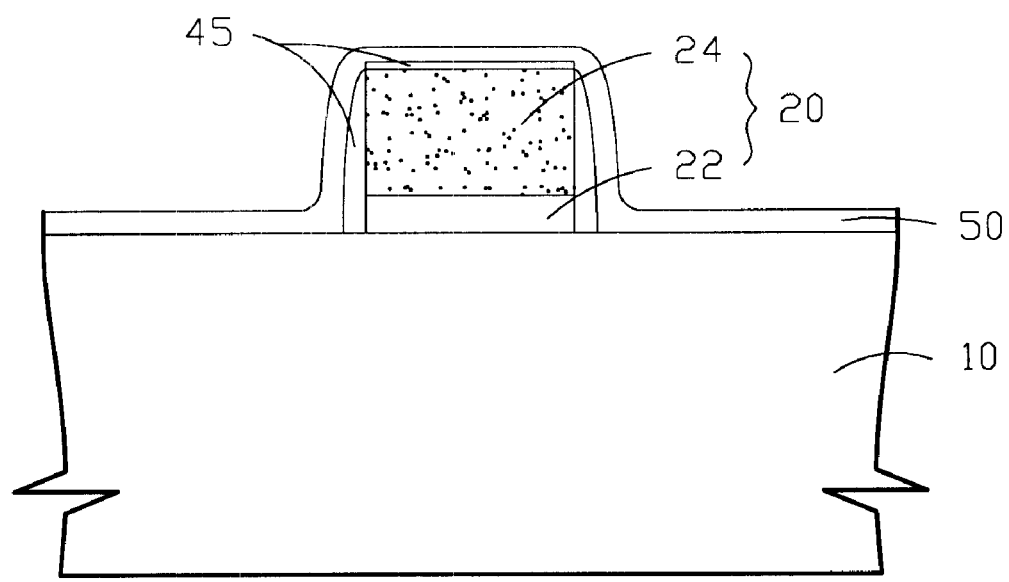
FIG. 6 shows a diagram in forming the second liner on the offset liner.

Referring to FIG. 6, after proceeding the lightly doped drain process, the second liner 50 is formed on the offset liner 45. The function of the second liner 50 is used to be the interface between the gate 20 and the spacer, which is produced in the back-end process to increase the combined quality of the gate 20 and the spacer and to prevent the electric leakage and stress defects occurring in the gate 20. The tetraethylorthosilicate or the high thermal oxide is usually used to be the material of the second liner 50. After forming the second liner 50, the surface of the second liner 50 will be treated by using the remote plasma nitridation process or the decouple plasma nitridation process to increase the hardness of the second liner 50 surface. Then the second liner 50 process is finished.

After treating the surface of the second liner 50 by using the remote plasma nitridation process or the decouple plasma nitridation process, the hardness of the second liner 50 surface is increased. No matter the amount of the by-product ions in the spacer, that forms in the back-end process, on the gate and the region under the gate, will be protected by using the hardened second liner. This hardened second liner will prevent by-product ions from moving from the spacer to the region, which is under the gate, and passing through the second liner by using actions in diffusion and drift to affect the voltage stability of the semiconductor device.

The present invention can decrease the chances of making the by-product ions move from the spacer to the gate or the region, which is under the gate, by improving the characters of the spacer, reducing the amounts of the by-product ions, which is produced in the spacer, and decreasing the proceeding temperature of the spacer process. The method, which is used in the embodiment, is atomic layer deposition method. In the traditional deposition process, the reaction gases are transmitted together into the chamber to proceed the deposition process on the location that is designed. But many by-product ions will be produced in the vapor deposition process. These by-product ions will be easily surrounded in the deposition layer and will not scatter easily. Especially in the rapid thermal process, the proceeding time is shorter. Therefore, the large amounts of the by-product ions will be produced in the spacer. These by-product ions will move to other regions easily by actions in diffusion and drift in the high temperature environment to affect the quality of the semiconductor device.

The method, which is used in the embodiment, is atomic layer deposition method. The principle of the atomic layer deposition method is to transmit the first gas at first. After the first gas reacting with the deposition location material, which is designed, the by-product ions, which are produced in the reaction, will be removed by using the inert gas. These waste gases will be exhausted from the chamber by a pump.

Then the second gas will be transmitted into the chamber to react with the first gas ions, which is deposited on the designed location, to form the needed production. The by-product ions, which are produced in the reaction, will be removed by using the inert gas. These waste gases will be exhausted from the chamber by a pump.

Figure 7:
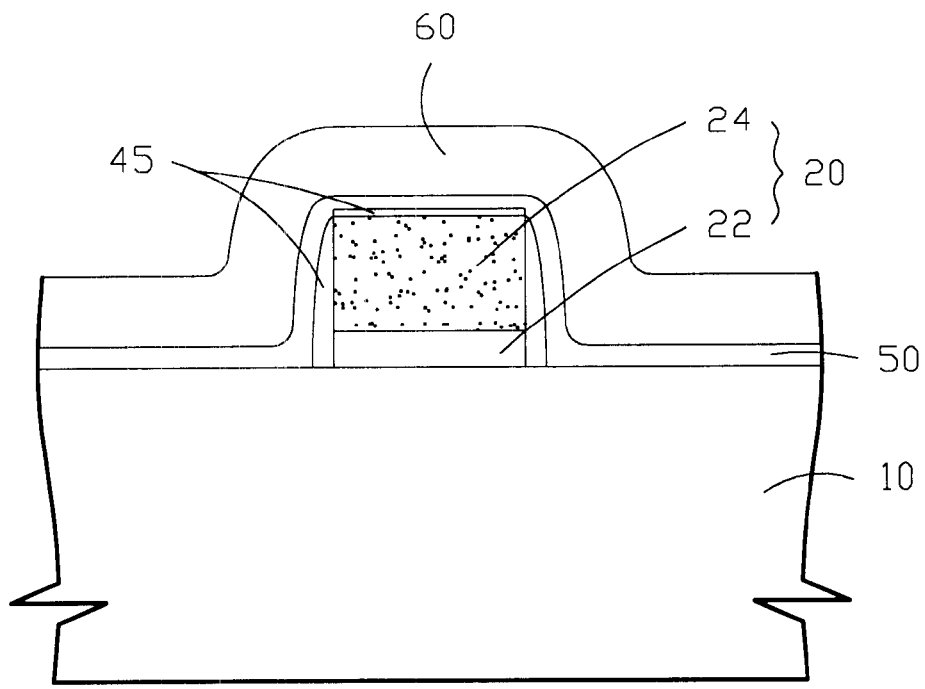
FIG. 7 shows a diagram in forming a spacer layer on the second liner.

Referring to FIG. 7, after forming the second liner 50, the spacer layer 60 is formed. Because the atomic layer deposition method is used, therefore, the spacer layer 60 has less amounts of the by-product ions than the spacer which is formed by using the traditional rapid thermal chemical vapor deposition process after the spacer layer 60 is formed. The temperature of the atomic layer deposition process is about 300 to 650° C. and the temperature is lower than the temperature of the rapid thermal chemical vapor deposition process. Therefore, this lower temperature can avoid the by-product ions, which are in the spacer layer 60, moving to other regions by the actions in diffusion and drift in the high temperature environment.

Figure 8:
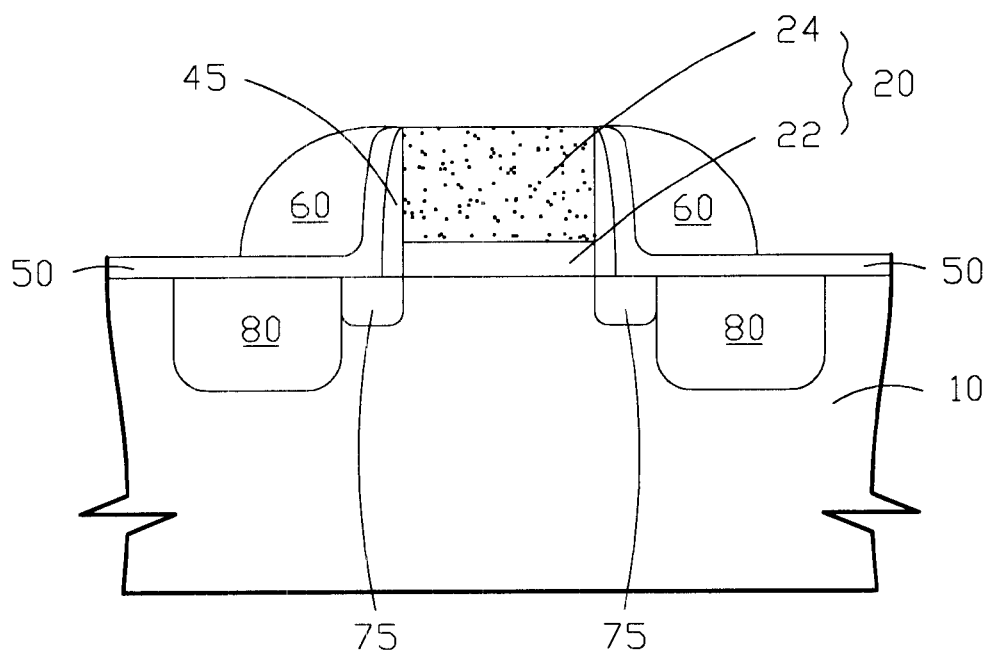
FIG. 8 shows a diagram in forming a spacer on the second liner.

Referring to FIG. 8, after the spacer layer 60 is formed, the partial spacer layer 60 is removed by using the etching process to form the shape of the spacer on the second liner 50. Then the partial offset liner 45 and the partial second liner 50 are removed by using the photolithography and the etching process to show the gate on the top of the gate. When the width of the process is shorter and shorter, the nitride, such as silicon nitride, is usually used to be the material of the spacer. Then the location of the lightly doped drain 75 and the source/drain 80 are decided and the ions are implanted to form the low thermal budget and high qualities metal oxide semiconductor transistor.

When the atomic layer deposition method is used to form the spacer, the spacer has fewer amounts of by-product ions and the thermal budget of the spacer process is lower. Therefore, the liner which is in the present invention is not needed to prevent the by-product ions moving from the spacer to the gate or the region, which is under the gate, by passing through the liner. But the speed of the atomic layer deposition process is too slow to conform to the needs of the process. Therefore, the present invention can use a complex spacer, offset liner, and the second liner to increase the efficiency of the process.

Figure 9:
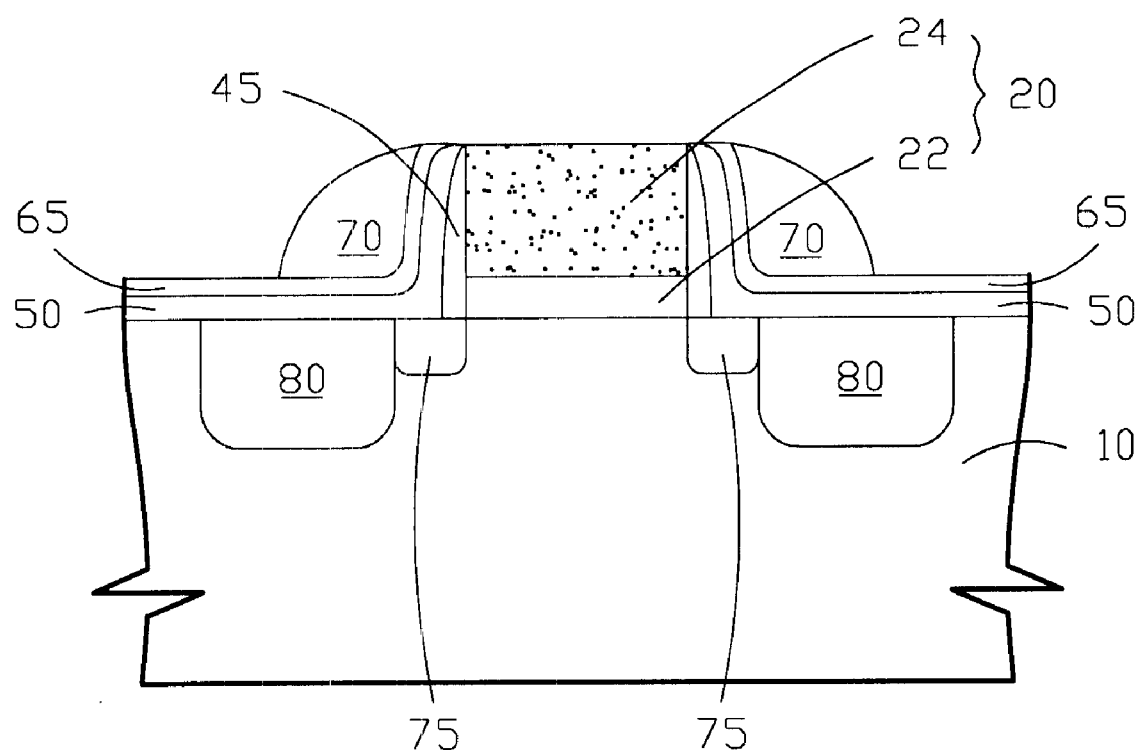
FIG. 9 shows a diagram in forming a complex spacer on the second liner.

After the offset liner and the second liner are formed on the gate and the substrate, the thin first spacer layer film is formed on the second liner by using the atomic layer deposition process. Then the second spacer layer is formed on the first spacer layer by using the rapid thermal chemical vapor deposition process. The material of the first spacer layer and the second spacer layer is usually the same. At last, the partial second spacer layer is removed by using the photolithography and the etching process to form the shape of the spacer, as showing in FIG. 9. The inner first spacer layer 65, that's formed on the second liner 50 by using the atomic layer deposition process, has less by-product ions and the ability to prevent by-product ions in the second spacer layer 70, from moving to the gate and the region, which is under the gate. Therefore, following the needs of the process, the common liner can be used to replace the offset liner and the second liner and also obtain higher voltage stability of the semiconductor device.

In accordance with the present invention, providing a method for preventing by-product ions from moving from a spacer to other regions with the use of an offset liner, a liner, whose surface is treated, and a spacer, which is formed by using the atomic layer deposition method or the rapid thermal chemical vapor deposition method. The present invention can also increase the voltage stability and the quality of the semiconductor device after the current is connected to the semiconductor device. The present invention can further increase the yield of the products, reduce the cost of the production, and increase the efficiency of the process.

Although specific embodiments have been illustrated and described, it will be obvious to those skilled in the art that various modifications may be made without departing from what is intended to be limited solely by the appended claims.

What is claimed is:

1. A method for preventing a by-product ion moving from a spacer, said method comprises:

forming a gate on a substrate, said gate comprising a gate oxide layer;

forming an offset liner on said gate and treating said offset liner with a first plasma treatment, wherein said offset liner is a tetraethylorthosilicate;

proceeding with a reoxide treatment process to treat said offset liner;

forming a liner on said offset liner and said substrate and treating said liner with a second plasma treatment;

forming a first spacer layer on said liner by a atomic layer deposition process;

forming a second spacer layer on said first spacer layer by a rapid thermal chemical vapor deposition process; and removing said partial first spacer layer, said partial second spacer layer, said partial liner, and said partial offset liner to form said spacer and to show a top of said gate.

2. The method according to claim 1, wherein said offset liner is a high thermal oxide.

3. The method according to claim 1, wherein said first plasma treatment is a remote plasma nitridation process.

4. The method according to claim 1, wherein said second plasma treatment is a decouple plasma nitridation process.

5. The method according to claim 1, wherein said first spacer layer is silicon nitride.

6. The method according to claim 1, wherein said second spacer layer is silicon nitride.

7. A method for preventing a by-product ion moving from a spacer, said method comprises:

forming a gate on a substrate, said gate comprising a gate oxide layer;

forming an offset liner on said gate and treating said offset liner with a first plasma treatment, wherein said offset liner is a tetraethylorthosilicate;

proceeding with a reoxide treatment process to treat said offset liner;

forming a liner on said offset liner and said substrate and treating said liner with a second plasma treatment;

forming a spacer layer on said liner by a rapid thermal chemical vapor deposition process; and removing said partial spacer layer, said partial liner, and said partial offset liner to form said spacer and to show a top of said gate.

8. The method according to claim 7, wherein said offset liner is a high thermal oxide.

9. The method according to claim 7, wherein said second plasma treatment is a remote plasma nitridation process.

10. The method according to claim 7, wherein said first plasma treatment is a decouple plasma nitridation process.

11. The method according to claim 7, wherein said spacer layer is silicon nitride.

12. A method for preventing a by-product ion moving from a spacer, said method comprises:

forming a gate on a substrate, said gate comprising a gate oxide layer;

forming a liner on said gate and said substrate;

forming a spacer layer on said liner by a atomic layer deposition process; and removing said partial spacer layer and said partial liner to form said spacer and to show said gate on a top of said gate.

13. The method according to claim 12, wherein said liner is treated with a plasma treatment.

14. The method according to claim 12, wherein said plasma treatment is a remote plasma nitridation process.

15. The method according to claim 12, wherein said plasma treatment is a decouple plasma nitridation process.

16. The method according to claim 12, wherein said spacer layer is silicon nitride.

17. The method according to claim 12, wherein said liner is a high thermal oxide.

* * * * *